United States Patent [19]

Halfacre et al.

[11] Patent Number: 4,574,467

[45] Date of Patent: Mar. 11, 1986

[54] N- WELL CMOS PROCESS ON A P SUBSTRATE WITH DOUBLE FIELD GUARD RINGS AND A PMOS BURIED CHANNEL

[75] Inventors: Mark A. Halfacre, Horsham; David S. Pan, Doylestown; Wing K. Huie, North Wales, all of Pa.

[73] Assignee: Solid State Scientific, Inc., Willow Grove, Pa.

[21] Appl. No.: 528,095

[22] Filed: Aug. 31, 1983

[51] Int. Cl.$^4$ .................. H01L 21/265; H01L 21/76
[52] U.S. Cl. .................. 29/571; 29/576 B; 29/578; 148/1.5; 357/42; 357/52
[58] Field of Search .................. 29/571, 576 B, 578, 29/590, 591; 148/1.5, 175, 187, DIG. 85; 357/52, 42, 44

[56] References Cited

U.S. PATENT DOCUMENTS

| | | | |
|---|---|---|---|
| 3,983,620 | 10/1976 | Spadea | 29/571 |
| 4,013,484 | 3/1977 | Boleky et al. | 148/187 X |
| 4,075,754 | 2/1978 | Cook, Jr. | 29/571 |
| 4,135,955 | 1/1979 | Gasner et al. | 148/187 |
| 4,277,291 | 7/1981 | Cerofolini et al. | 29/571 X |
| 4,299,024 | 11/1981 | Piotrowski | 29/577 C |
| 4,385,947 | 5/1983 | Halfacre et al. | 29/571 X |
| 4,391,650 | 7/1983 | Pfeifer et al. | 29/576 B X |
| 4,435,895 | 3/1984 | Parrillo et al. | 29/571 |
| 4,470,191 | 9/1984 | Cottrell et al. | 29/571 X |
| 4,474,624 | 10/1984 | Matthews | 29/571 X |
| 4,480,375 | 11/1984 | Cottrell et al. | 29/571 X |

Primary Examiner—Brian E. Hearn
Assistant Examiner—David A. Hey

[57] ABSTRACT

CMOS transistors are fabricated in a P substrate using N- well regions. These wells are positioned to prevent aluminum spiking in the N channel devices. After P guard rings are formed for both P and N channel devices, additional masking and implantation are performed to produce N guard rings in the P channel devices. Before the transistors are formed, an implantation of P type impurities is performed causing the P channel devices, when they are formed, to have a PMOS buried channel.

3 Claims, 15 Drawing Figures

N- WELL CMOS PROCESS ON A P SUBSTRATE WITH DOUBLE FIELD GUARD RINGS AND A PMOS BURIED CHANNEL

BACKGROUND OF THE INVENTION

1. Field of the Invention

The present invention relates to improved methods of fabrication of CMOS read only memories. Particularly, it relates to a method of forming double field guard rings, a method of forming a PMOS buried channel, and a method of preventing aluminum spiking.

2. Background Art

Methods of fabricating CMOS devices with guard rings are well-known in the art. See, for example, Gasner, et al., U.S. Pat. No. 4,135,955. In Gasner, et al., a P- well is formed in an N type and through the successive application of masking layers and diffusion steps guard rings are created. The presence of the guard rings results in higher performance. However, this method is not applicable to an N- well in a P substrate.

A problem common to PMOS devices is the mobility of carriers in the channel region between the source and the drain. In the past the electric field created during operation of a field effect transistor would pull holes up to this channel creating a very shallow surface inversion layer which provided low carrier mobility. In this method N type starting material was used and a low dose P type implant into the channel was performed, creating an N-- layer. Another method used is forming the region out of N-- material. However, a method of performing an ion implant in this channel region, which would create a permanent P type high mobility channel with more depth would allow the CMOS device to be driven faster.

A cause of failure in NMOS devices is aluminum spiking. In this problem the aluminum of the metallization combines through the contact with the material of the N+ source and drain of field effect transistors, causing them to be driven through to the substrate underneath. As a result there is created a short circuit between the metallization and contact layer and the substrate beneath the source and drain.

It is therefore an object of this invention to achieve an N- well process in a P substrate with higher performance.

Another object of this invention is to provide a method for producing N- well CMOS process substrate with double field guard rings in order to permit the operation of higher performance CMOS devices reliably in the 10 to 20 volt range.

A further object of this invention is to provide a method for producing a permanent high mobility PMOS buried channel between the source and drains of field effect transistors.

It is an additional object of this invention to provide a method for preventing aluminum spiking between the metallization and contact layer of CMOS devices and the substrate beneath the source and drains.

SUMMARY OF THE INVENTION

CMOS transistors are fabricated in a P substrate by applying a first mask with openings for introducing N type impurities to form N- well regions. The wells used for the N channel devices are positioned so as to prevent aluminum spiking. A second mask layer of oxidation inhibiting material is applied over the region in which the transistors are to be formed, followed by a third mask layer over the wells. P type impurities are introduced into the surface of the substrate to form P guard rings except in the masked portions of the N- well regions. A further masking layer is formed except over the regions in which the P channel MOS transistors are to be formed and N type impurities are introduced to form N guard rings in these unmasked regions, resulting in double field guard rings. The substrate is oxidized to form a thick oxide layer and P type impurities are introduced in the channel region of the CMOS transistors causing buried PMOS channels to be formed in the P channel transistors.

DETAILED DESCRIPTION OF THE INVENTION

Figure 1:
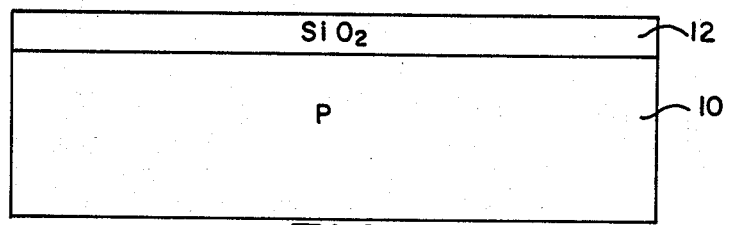
FIGS. 1 through 14 are cross-sectional views of a substrate illustrating formation of CMOS devices at various stages according to the methods of the present invention.

The method of fabricating CMOS devices according to the present invention starts as illustrated in FIG. 1 in which a P- type substrate 10 has a relatively thin oxide layer 12 formed thereon. Substrate 10 may have a crystalline orientation of [100], a resistivity of 2.5–80 ohm-centimeters and an impurity concentration in the range of $1 \times 10^{14}$ to $5 \times 10^{15}$ carriers per cubic centimeter. Oxide layer 12 may be silicon dioxide having a thickness of approximately 1,000 angstroms. First masking layer 14 is applied and openings 16a–c are formed in first mask 14 and oxide layer 12 to expose respective surface regions 18a–c of substrate 10. N type wells will be formed at surface regions 18a–c. Masking layer 14 is preferably a photosensitive resist material which is applied, exposed to the desired pattern and then etched.

Figure 2:
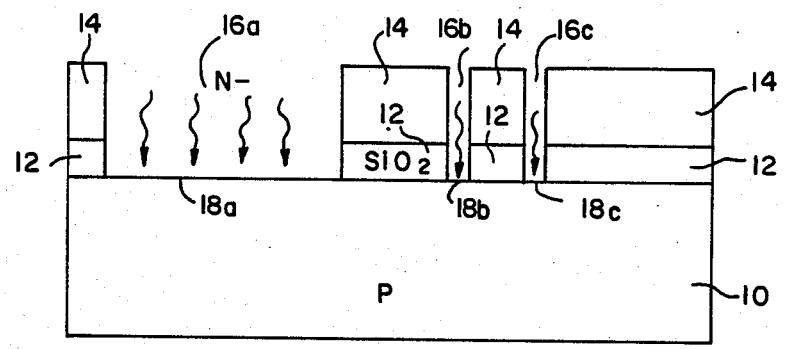
Figure 3:
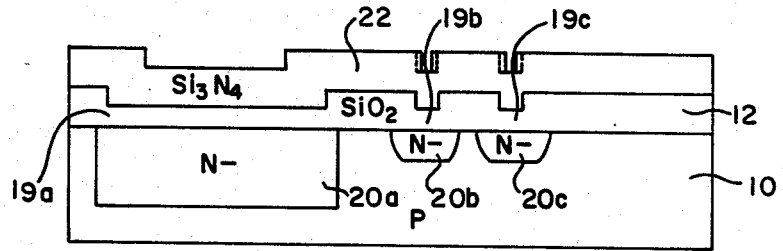

N conductivity type impurities, for example phosphorus, are ion implanted into the surface regions 18a–c of substrate 10 as illustrated in FIG. 2. The N type impurities are diffused to form N- wells 20a–c as illustrated in FIG. 3. The region above well 20a is used to form a P channel transistor and the region above wells 20b,c is used to form an N channel transistor. N- well 20a has a depth of approximately 2–6 microns. N- wells 20b,c are more shallow because openings 16b,c have a smaller surface area allowing less diffusion of ions. During the diffusion of N- wells 20a–c, very thin regions of oxide 19a–c are formed over the well surfaces 18a–c respectively. Oxide regions 19a–c join with oxide layer 12 to form a continuous layer. In conventional manner prior to the diffusion process, photo resist layer 14 is removed.

The surface concentration of the N type impurities in N- wells 20a–c should be in the range of $1 \times 10^{15}$ to $3 \times 10^{16}$ carriers per cubic centimeter. This range is important to prevent punchthrough in P channel MOS devices having short channels.

A second masking layer of oxide inhibiting material 22 is applied to the substrate to form a mask over the regions in which CMOS transistors are to be formed. As illustrated in FIG. 3 second mask oxide inhibiting layer 22, which may be silicon nitride, is deposited over the entire surface of oxide layer 12.

Figure 4:
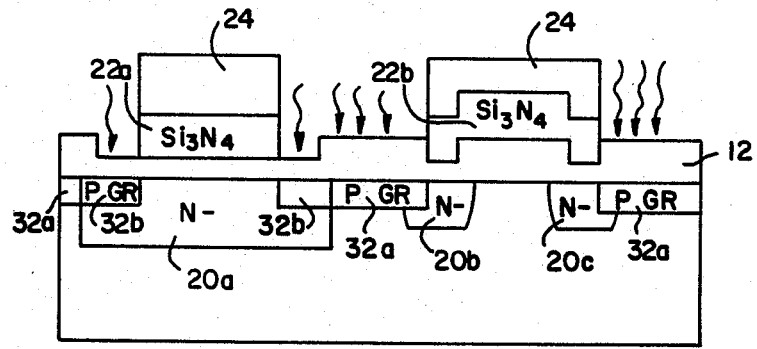

Layer 22 is delineated into regions 22a,b using a photosensitive resist material 24 and a plasma nitride etch although other methods of delineating second masking layer 22 may be used. As shown in FIG. 4 mask region 22a is formed above N- well 20a and mask region 22b is formed above N- wells 20b,c. P type impurities are then ion implanted to form P guard rings 32a,b at the surface of substrate 10 except where masked by resist material 24 and silicon nitride regions 22a,b. This combination of masking regions 22a,b, resist material 24, and N- wells effectively forms a complete guard ring structure for all surface regions of the substrate except those regions in which transistors are to be formed. Resist material 24 is then removed.

Figure 5:
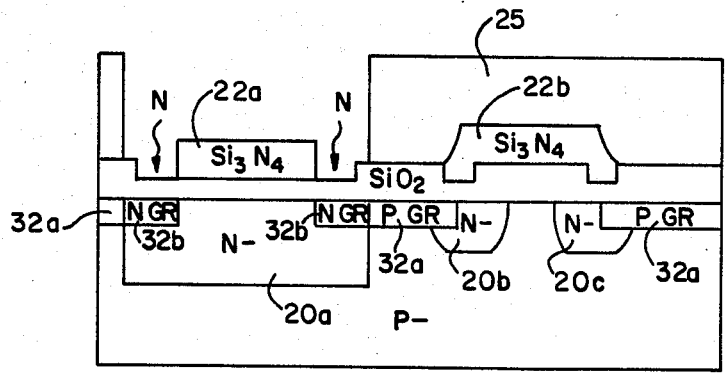

A third masking layer 25 is applied to the substrate and delineated above the entire substrate except above N- well 20a. As with the first masking layer, the third masking layer 25 may be a photosensitive resist material which is applied, exposed and etched. The resultant structure, including second mask regions 22a,b is shown in FIG. 5. N type impurities are then ion implanted to form N guard rings 32b at the surface of substrate 10 except where masked by photo resist layer 25 and second mask region 22a. This combination of masking layers and N- well 20a forms N guard ring structures 32b in the area where P guard rings 32b had been formed previously. Thus, substrate 10 contains double field guard rings, including both the remaining P guard rings and the newly formed N guard rings. The formation of N guard rings permits circuit performance at higher voltage levels. The third masking layer 25, which protected P guard rings 32a from the N type ion implants, is then removed.

Figure 6:
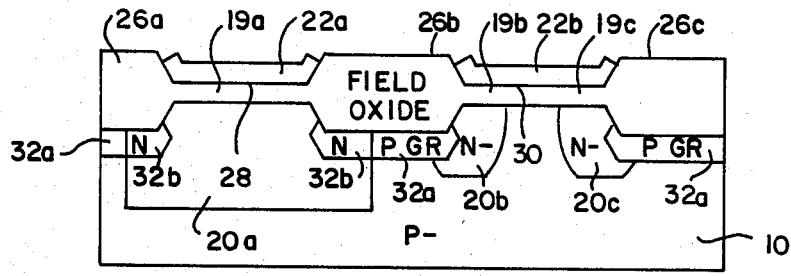

The substrate is then exposed to an oxidizing atmosphere to grow a field oxide at all the surfaces of substrate 10 except those masked by silicon nitride regions 22a,b. Regions 22a,b block diffusion of the oxidizing species to the underlying substrate, thereby preventing oxidation of device areas. Some of the steam used in the oxidation penetrates below the edges of 22a,b, causing the "bird's beak" effect which results in the shapes of 22a,b seen in FIG. 9. As illustrated in FIG. 6, field oxide layers 26a–c are grown into substrate 10 as well as above the substrate to partially planarize the surface and to vertically isolate transistor surface regions 28 and 30 from substrate 10, N-well regions 20a–c, and guard rings 32a and 32b. This allows better step coverage and improved definition of subsequent levels. Field oxide layers 26a–c are formed to be sufficiently thick to mask the subsequent implants forming the source and drain regions in the surface areas 28 and 30. At this stage of the process field oxide 26a–c has an approximate depth of about 8000 angstroms.

Figure 7:
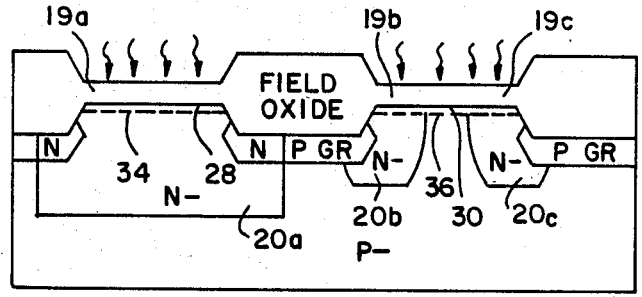

Silicon nitride regions 22a,b are stripped in boiling phosphoric acid to expose oxide layers 19a–c as seen in FIG. 7. P type impurities, for example Boron, are ion implanted through surface regions 28 and 30. This implantation is a channel-adjust doping operation used to determine the threshold voltage of the P channel MOS transistor and the N channel MOS transistor to be formed in surface regions 28 and 30 respectively. The resulting ion implantation regions are a P region 34 in N- well 20a and a P region 36 in the P- substrate 10 and N- wells 20b,c.

The resultant impurity concentration of the P type region 34 is in the range of $5 \times 10^{15}$ to $1 \times 10^{17}$ carriers per cubic centimeter and the resultant impurity concentration of the P type region 36 is in the range of $5 \times 10^{15}$ to $1 \times 10^{17}$ carriers per centimeter. If the threshold voltage of the two MOS devices cannot be achieved by a single channel-adjust doping step P conductivity type impurities may be introduced using two doping steps, one for the P channel MOS device to be formed in surface region 34 and one for the N channel MOS transistor to be formed in surface region 36.

Figure 8:
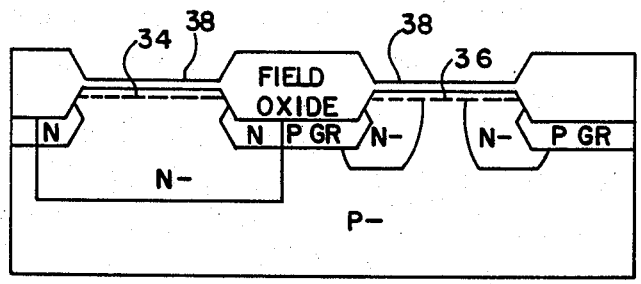
Figure 9:
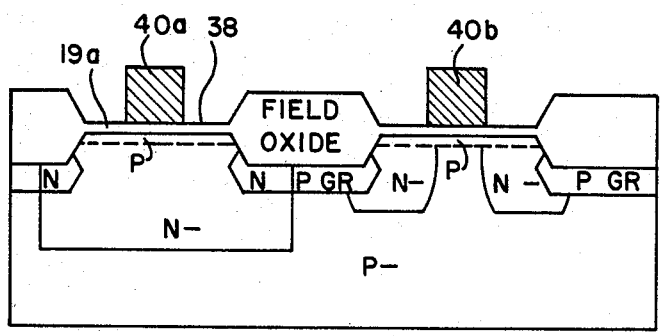

CMOS transistors are then formed in the surface region 34 and 36 using a self-aligning technique similar to that described in U.S. Pat. No. 4,075,754 to Cook. The Cook patent is incorporated herein by reference. Gate oxide layer 38 is formed where layers 19a–c had been on surfaces 34 and 36 in FIG. 8, followed by the application of gate material which is applied and delineated as seen in FIG. 9, forming gates 40a,b. Preferably the gate material is a polycrystalline silicon having a thickness of approximately 3,000 to 6,000 angstroms. The gate oxide preferably has a thickness of approximately 100 to 500 angstroms. The thickness of polycrystalline layer gates 40a,b is selected to be an effective mask against the impurities to be implanted to form the source and drain regions of the MOS transistors. It should be noted that the polycrystalline layer gates 40a,b may be doped with N type impurites to reduce their resistance prior to delineation.

Figure 10:
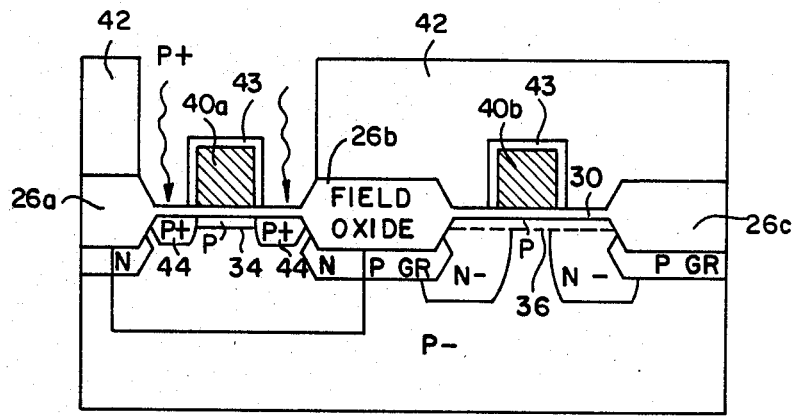

Following the formation of polycrystalline silicon oxide layers 43 on gates 40a,b a masking layer 42 is provided over surface region 36 to protect the N- channel MOS device from ion implantation. This ion implantation is performed to develop the source and drain of the P channel transistor. P type impurities, for example boron, are ion implanted into surface 34 using the field oxide 26a–c and the gate material of gates 40a,b as alignment masks. This is followed by removal of mask 42 using conventional techniques. The ion implantation causes the P+ source and drain regions 44 to be formed in alignment with the gate and the field oxide as illustrated in FIG. 10. This reduces the gate-to-source drain capacitance. What remains of P type region 34 between P+ source and drain regions 44 constitutes a PMOS buried channel device. The creation of this channel removes the problem of low carrier mobility in the more shallow inversion layer which would be created during operation of the transistor and allows the speed necessary for very large scale integration.

Figure 11:
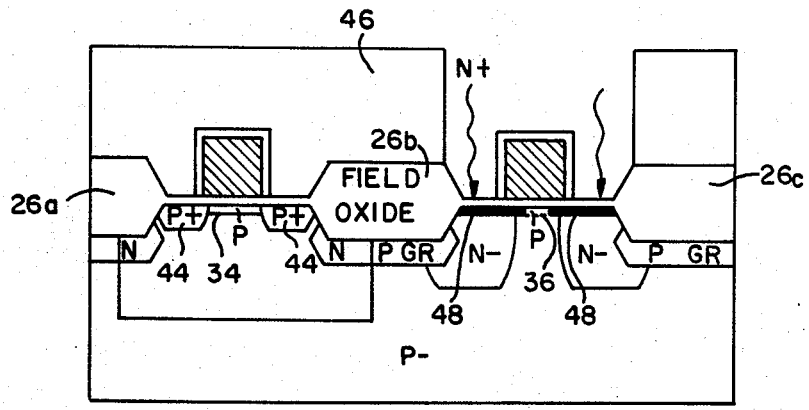

In manner similar to that shown in FIG. 10, a masking layer 46 is provided over the PMOS device surface area 34, source and drain regions 44, and field oxide regions 26a–c. N type impurities such as phosphorus or arsenic are introduced to surface region 36 to form source and drain regions 48 for the N channel devices as illustrated in FIG. 11.

Figure 12:
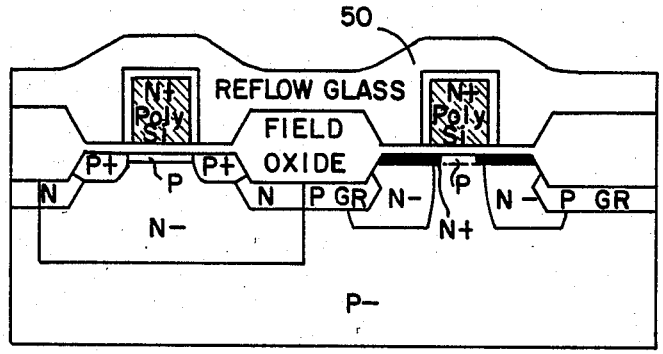
Figure 13:
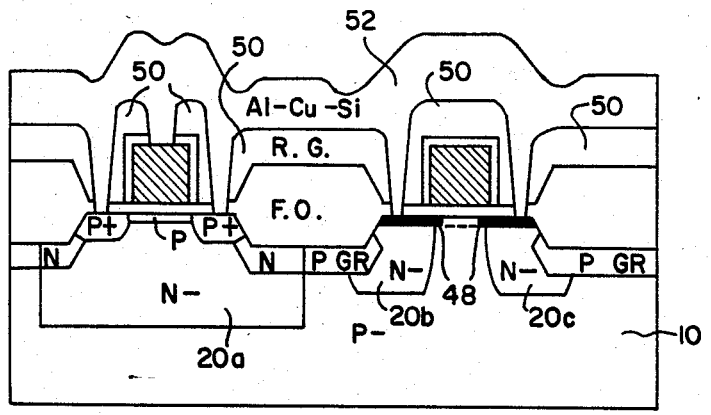

In FIG. 12 masking layer 47 is removed and reflow glass deposition is performed. In this deposition the substrate is covered with a dielectric layer 50 of silox. Dielectric layer 50 provides insulation between the metal interconnect layer and the other layers. Apertures are provided in the silox and the metal interconnect deposition is performed to form contact and interconnect layer 52. As illustrated in FIG. 13 contact and interconnect layer 52 may be silicon doped aluminum. A small amount of copper may also be added to alleviate stress in layer 52.

Figure 14:
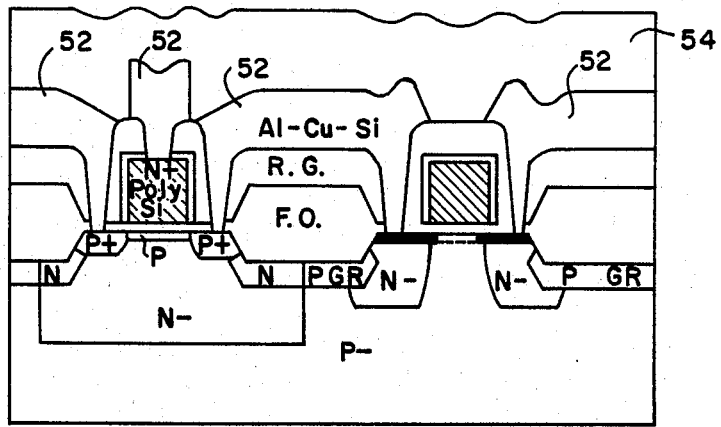
Figure 15:
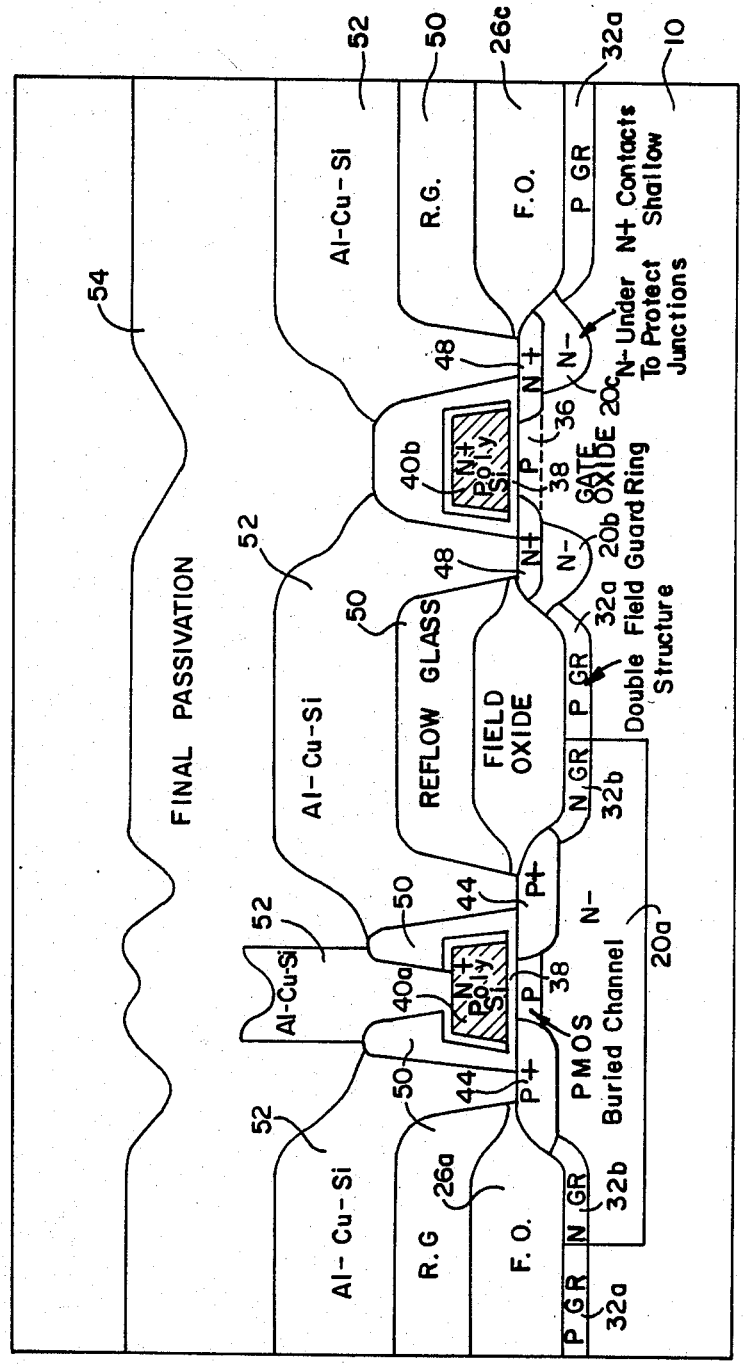
FIG. 15 is a cross-sectional view of a substrate illustrating the resulting CMOS devices, having double field guard rings, a PMOS buried channel and N conductivity type well regions fabricated therein in accordance with the principles of the present invention.

FIG. 13 also shows the improvement offered by the formation of N- wells 20b,c. These wells lie beneath the regions where interconnect layer 52 makes contact with source and drain region 48. Wells 20b and 20c are thus between contact layer 52 and P- substrate 10, giving protection from aluminum spiking. The problem of aluminum spiking could arise in NMOS devices when the aluminum of an interconnect consumes the silicon of shallow N+ source or drain 48 and makes contact with P- substrate 10. By interposing N- wells 20b,c this problem is prevented. FIG. 14 shows the final passivation layer 54. The function of this layer is to provide scratch protection for the finished substrate.

The above described process may be used for fabricating N and P channel devices with channel lengths down to the micron and submicron range by proper adjustment of the N- well impurity implant and the channel adjust doping implant. In the operation of the MOS transistor, the biasing causes the surface region of the channel to invert creating a conductive path between the source and drain regions. In addition to the inverted channel regions, a reverse bias depletion region forms about the source, drain and channel. Punchthrough occurs when the lowest corners of the source and drain depletion regions touch. This results in a flow between these corners. To prevent punchthrough, the impurity concentration of the channel region must be increased.

For the P channel device, the impurity concentration of the N- well 20a is increased in order to prevent punchthrough. The impurity concentration for the surface region of the N- well 20a should be in the range of $1 \times 10^{15}$ to $3 \times 10^{16}$ carriers per cubic centimeter. Since the impurity concentration of the N- well 20a is increased, the dose of the ion implant for the channel-adjust step which creates the PMOS buried channel 34 must also be increased to produce the desired threshold voltage for the P channel MOS device.

For the N channel device, the channel adjusting ion implant not only determines the threshold voltage of the N channel MOS device, but also prevents punchthrough since it increases the impurity concentration of the P-substrate. Likewise, P region 36 prevents punchthrough as well as determining the threshold value of the N channel MOS device. As discussed previously, the boron or P impurity implant illustrated in FIG. 7 may be a single implant to modify the channel regions thereby determining the threshold value of the P channel and N channel MOS devices to prevent punchthrough of the P channel device. Alternately, two separate P impurity implant steps may be used, one for the N channel device and one for the P channel device. Thus, it is evident that the process described above is capable of forming CMOS devices of any channel length even in the submicron range. This process requires no additional steps and only requires modification of the impurity levels of the N- wells 20a-c and the P impurity levels introduced during the channel-adjust doping step.

We claim:

1. A method of fabricating complimentary P-channel and N-channel insulated gate field effect transistors in a P-conductivity type substrate which comprises the steps of:
    (a) forming a first masking layer over said substrate with a first opening to define the surface of said P-channel transistor, and a second and third opening at the surface areas at which a source and drain of said N-channel transistor is to be formed;
    (b) simultaneously introducing impurities into said substrate through said first, second and third openings to form a deep N-conductivity type well region in which said P-channel transistor is to be formed and to form deep N-conductivity type well regions in which respectively said source and drain of said N-channel transistor is to be formed;
    (c) removing said first masking layer;
    (d) growing a gate oxide layer over the substrate region at which said N-channel transistor is to be formed;
    (e) forming a conductive gate over a central portion of said N-channel transistor region; and
    (f) implanating N-type impurities through said gate oxide on either side of said gate into said source and drain areas to form said source and drain of said N-type transistor which are substantially more heavily doped and shallower than said corresponding underlying N-type wells.

2. The method of claim 1 additionally comprising depositing one and another aluminum conductors over said substrate selectively contacting central portions respectively of said source and said drain, so that any penetration of said aluminum conductors through said shallow source and/or said shallow drain will be prevented by said underlying N-wells from contacting and shorting to said P-type substrate.

3. The method of claim 1 wherein said forming and said gate is accomplished by depositing a layer of polycrystalline silicon material over said oxide layer and removing portions of said silicon layer to define said gate that is formed of said polycrystalline silicon material.

* * * * *